US007016433B2

United States Patent
Demir et al.

(10) Patent No.: US 7,016,433 B2
(45) Date of Patent: Mar. 21, 2006

(54) METHOD AND SYSTEM FOR COMPENSATING FOR PHASE VARIATIONS INTERMITTENTLY INTRODUCED INTO COMMUNICATION SIGNALS BY ENABLING OR DISABLING AN AMPLIFIER

(75) Inventors: Alpaslan Demir, Commack, NY (US); Leonid Kazakevich, Plainview, NY (US); Tanbir Haque, Long Island City, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 84 days.

(21) Appl. No.: 10/736,381

(22) Filed: Dec. 15, 2003

(65) Prior Publication Data

US 2004/0247056 A1   Dec. 9, 2004

Related U.S. Application Data

(60) Provisional application No. 60/476,753, filed on Jun. 6, 2003.

(51) Int. Cl.
*H04L 25/66* (2006.01)
*H04L 25/10* (2006.01)
(52) U.S. Cl. ............... 375/318; 375/296; 375/326; 455/68
(58) Field of Classification Search ............ 375/318, 375/261, 235, 296, 326, 330; 370/206; 455/68, 455/67.11, 232.1; 330/252, 254, 278
See application file for complete search history.

(56) References Cited

U.S. PATENT DOCUMENTS

| 6,556,076 | B1 | 4/2003 | Posner et al. |
| 6,819,720 | B1 * | 11/2004 | Willetts ...................... 375/296 |
| 2003/0069049 | A1 | 4/2003 | Poranen et al. |
| 2003/0174641 | A1 * | 9/2003 | Rahman ..................... 370/206 |
| 2004/0146122 | A1 * | 7/2004 | Fague et al. ................ 375/326 |
| 2004/0203472 | A1 * | 10/2004 | Chien .......................... 455/68 |

* cited by examiner

Primary Examiner—Khai Tran
Assistant Examiner—Edith Chang
(74) Attorney, Agent, or Firm—Volpe and Koenig, P.C.

(57) ABSTRACT

A communication system including an amplifier, a receiver, an analog to digital converter (ADC) and an insertion phase variation compensation module. The amplifier receives a communication signal. If the amplifier is enabled, the amplifier amplifies the communication signal and outputs the amplified communication signal to the receiver. If the amplifier is disabled, the amplifier passes the communication signal to the receiver without amplifying it. The receiver outputs an analog complex signal to the ADC. The ADC outputs a digital complex signal to the insertion phase variation compensation module which counteracts the effects of a phase offset intermittently introduced into the communication signal when the amplifier is enabled or disabled.

78 Claims, 6 Drawing Sheets

METHOD AND SYSTEM FOR COMPENSATING FOR PHASE VARIATIONS INTERMITTENTLY INTRODUCED INTO COMMUNICATION SIGNALS BY ENABLING OR DISABLING AN AMPLIFIER

CROSS REFERENCE TO RELATED APPLICATION(S)

This application claims priority from U.S. provisional application No. 60/476,753, filed Jun. 6, 2003, which is incorporated by reference as if fully set forth.

FIELD OF THE INVENTION

The present invention generally relates to wireless communication systems. More particularly, the present invention relates to digital signal processing (DSP) techniques used to compensate for phase variations associated with switching an amplifier on or off.

BACKGROUND

In a conventional phase-sensitive communication system, a receiver uses an amplifier to control the power level of a radio frequency (RF) and/or intermediate frequency (IF) communication signals. Typically, one or more amplifiers, (i.e., gain stages), are used to amplify the communication signals. Preferably, low noise amplifiers (LNAs) are used because they have a low noise figure, and thus they do not significantly raise the noise floor of the communication system.

Because the communication signals have different power levels when they are received, the amplifier(s) is intermittently switched on or off which causes sizable phase offsets to be introduced into the communication signals. Such phase offsets degrade the performance of the phase-sensitive communication system. A method and system for canceling the phase offset of communication signals caused by turning an amplifier on or off is desired.

SUMMARY

The present invention is incorporated into a communication system which includes an amplifier, (i.e., gain stage), a receiver, an analog to digital converter (ADC) and an insertion phase variation compensation module. The amplifier receives a communication signal. If the amplifier is enabled, the amplifier amplifies the communication signal and outputs the amplified communication signal to the receiver. If the amplifier is disabled, the amplifier passes the communication signal to the receiver without amplifying it. The receiver outputs an analog complex signal to the ADC. The ADC outputs a digital complex signal to the insertion phase variation compensation module which counteracts the effects of a phase offset intermittently introduced into the communication signal when the amplifier is enabled or disabled (i.e., turned on or off). The analog and digital complex signals include in-phase (I) and quadrature signal components.

An amplification control signal is provided to the amplifier on an intermittent basis. The amplification control signal either turns on or turns off the amplifier. An estimate of the phase offset is provided to the insertion phase variation compensation module as a function of the amplification control signal.

The insertion phase variation compensation module may receive the digital I and Q signal components from the ADC and output altered I and Q signal components having different phase characteristics than the digital I and Q components. The communication system may further include a modem which receives the altered I and Q signal components. The modem may include a processor which generates the amplification control signal. The processor may calculate how much power is input to the ADC.

The communication system may further include a look up table (LUT) in communication with the processor and the insertion phase variation compensation module. The LUT may receive the amplification control signal from the processor and provide an estimate of the phase offset to the insertion phase variation compensation module as a function of the amplification control signal. The provided estimate may include a Sin function and a Cos function of a phase offset, x. The insertion phase variation compensation module may have a real, Re, input associated with a digital I signal component and an imaginary, Im, input associated with a Q signal component and, based on the estimate provided by the LUT, the insertion phase variation compensation module may output an I signal component having a phase that is adjusted in accordance with the function $(\text{Cos}(x) \times \text{Re}) - (\text{Sin}(x) \times \text{Im})$ and a Q signal component having a phase that is adjusted in accordance with the function $(\text{Sin}(x) \times \text{Re}) + (\text{Cos}(x) \times \text{Im})$.

The communication signal may include first and second time slots separated by a guard period. During the guard period, which occurs after data in the first time slot is received by the amplifier and is processed, the amplification control signal may be provided to the amplifier and, in response, the amplifier may be either enabled or disabled. When data in the first time slot is received by the amplifier when it is disabled, the data in the second time slot may received by the amplifier when it is enabled. When data in the first time slot is received by the amplifier when it is enabled, the data in the second time slot is received by the amplifier when it is disabled. Also, during the guard period, the estimate of the phase offset may be provided to the insertion phase variation compensation module and the insertion phase variation compensation module may adjust the phase of the communication signal based on the provided estimate.

BRIEF DESCRIPTION OF THE DRAWINGS

A more detailed understanding of the invention may be had from the following description of a preferred example, given by way of example and to be understood in conjunction with the accompanying drawing wherein.

DETAILED DESCRIPTION OF THE PREFERRED EMBODIMENTS

The present invention provides a method and system that cancels out the phase difference introduced into an RF or IF communication signal, (i.e., data stream), by turning on or off an amplifier.

Preferably, the method and system disclosed herein is incorporated into a wireless transmit/receive unit (WTRU). Hereafter, a WTRU includes but is not limited to a user equipment, mobile station, fixed or mobile subscriber unit, pager, or any other type of device capable of operating in a wireless environment. The features of the present invention may be incorporated into an integrated circuit (IC) or be configured in a circuit comprising a multitude of interconnecting components.

The present invention is applicable to communication systems using time division duplex (TDD), time division multiple access (TDMA), frequency division duplex (FDD), code division multiple access (CDMA), CDMA 2000, time division synchronous CDMA (TDSCDMA), orthogonal frequency division multiplexing (OFDM) or the like.

Figure 1:
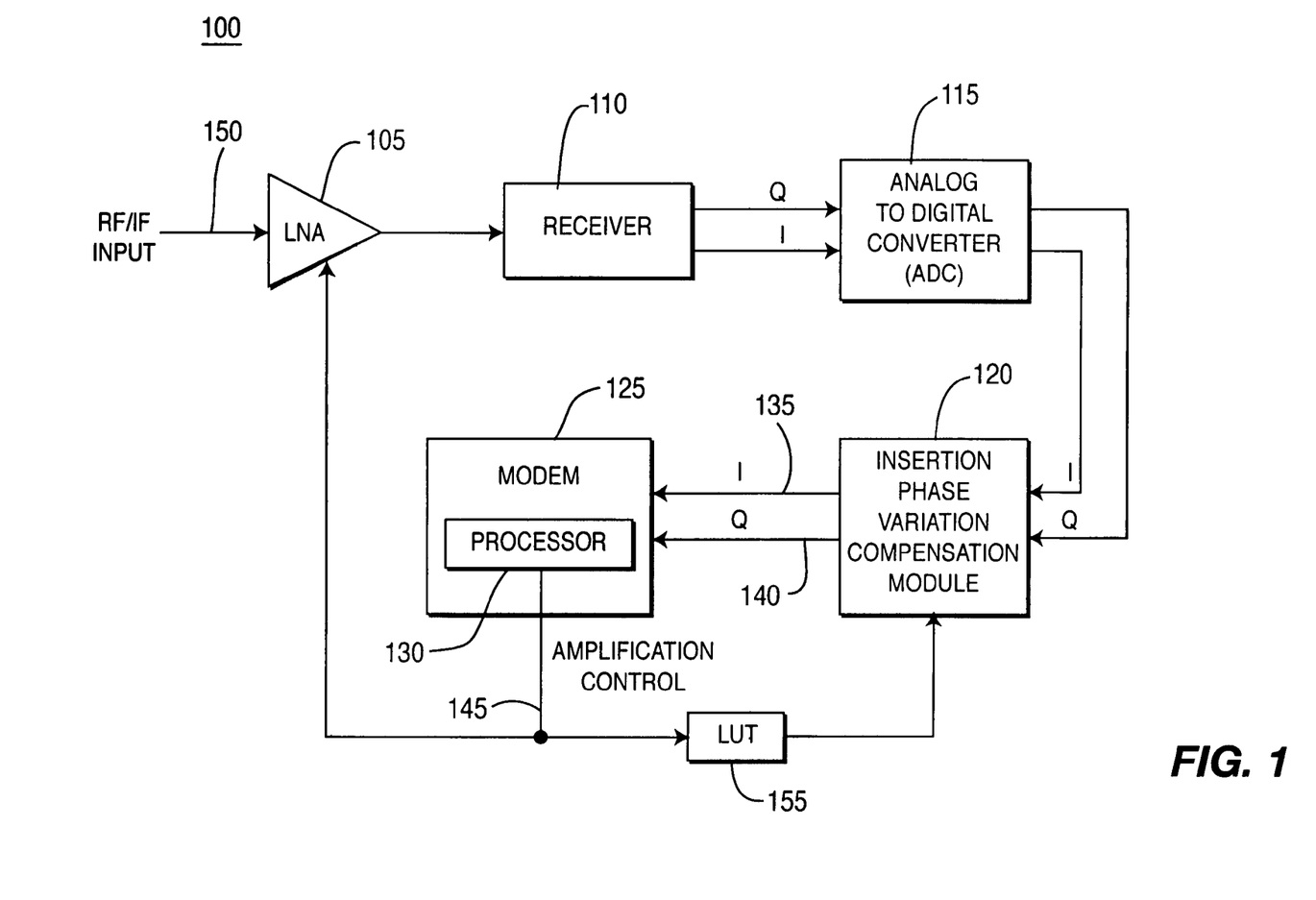
FIG. 1 is a block diagram of a communication system including an insertion phase variation compensation module that cancels out a phase offset intermittently introduced into a communication signal by turning on or off an amplifier in accordance with the present invention.

FIG. 1 is a block diagram of a communication system 100 operating in accordance with the present invention. Communication system 100 includes an amplifier (e.g., LNA) 105, a receiver 110, an analog to digital converter (ADC) 115, an insertion phase variation compensation module 120 and a modem 125. The amplifier 105 and the ADC 115 may be incorporated into receiver 110. Furthermore, the insertion phase variation compensation module 120 may be incorporated into the modem 125. The modem 125 includes a processor 130 which calculates how much power is input to the ADC 115. The modem 125 receives complex I and Q signal components 135, 140, from the insertion phase variation compensation module 120, and, via processor 130, outputs an amplification control signal 145 to the amplifier 105. The amplification control signal 145 either enables or disables the amplifier 105. The amplifier 105 may consist of a single gain stage or multiple gain stages (i.e., the amplifier 105 may represent a chain of amplifiers which are all controlled by the same amplification control signal 145). When the amplifier 105 is disabled, (i.e., turned off), an RF and/or IF communication signal 150 passes through amplifier 105 without being amplified. When the amplifier 105 is enabled, (i.e., turned on), the communication signal 150 is amplified accordingly. The amplification control signal 145 is also output from the processor 130 to a look up table (LUT) 155, which uses the amplification control signal 145 to provide the insertion phase variation compensation module 120 with an estimate of the phase offset that is introduced into the communication signal 150.

Each time the amplifier 105 is enabled or disabled, an associated phase offset, i.e., phase rotation, may be introduced into the communication signal 150. The phase offset is considerable. For example, the phase of the communication signal 150 may change by a significant amount (i.e., rotate, by 80 or 90 degrees). An estimate of the phase offset (x) as a function of the state (i.e., turned on or turned off) of amplifier 105 may be determined by accessing the LUT 155, a predefined polynomial, or any other method that can map the status of the amplifier, i.e., enabled or disabled, to a phase offset estimate.

Figure 2:
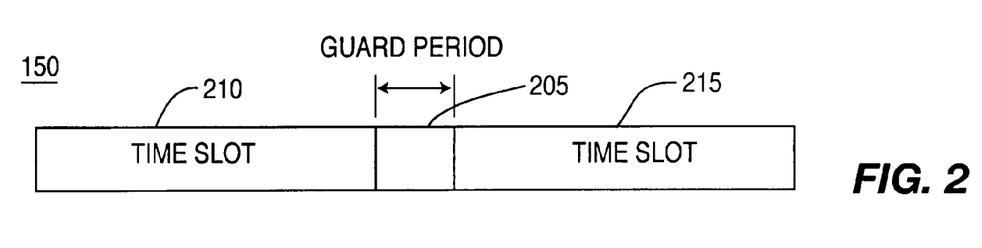
FIG. 2 illustrates an exemplary communication signal having a guard period which occurs between two time slots.

FIG. 2 illustrates an example of a communication signal 150 having a guard period 205 which occurs between two time slots 210, 215. This exemplary communication signal may be used under the presumption that communication system 100 is a TDD, TDMA, TDSCDMA or other time-slotted communication system. In this example, data in the communication signal 150 is communicated via the time slots 210 and 215. Thus, the only time that the amplifier 105 may be enabled or disabled without disrupting the data in the time slots 210, 215, of communication signal 150, is during the guard period 205. Any phase offset resulting from turning on or off the amplifier 105 is cancelled by the insertion phase variation compensation module during the same guard period 205 such that the phase offset or the cancellation thereof will not degrade the quality of the data received in the time slot 215 that occurs after the guard period 205 expires.

Figure 3:
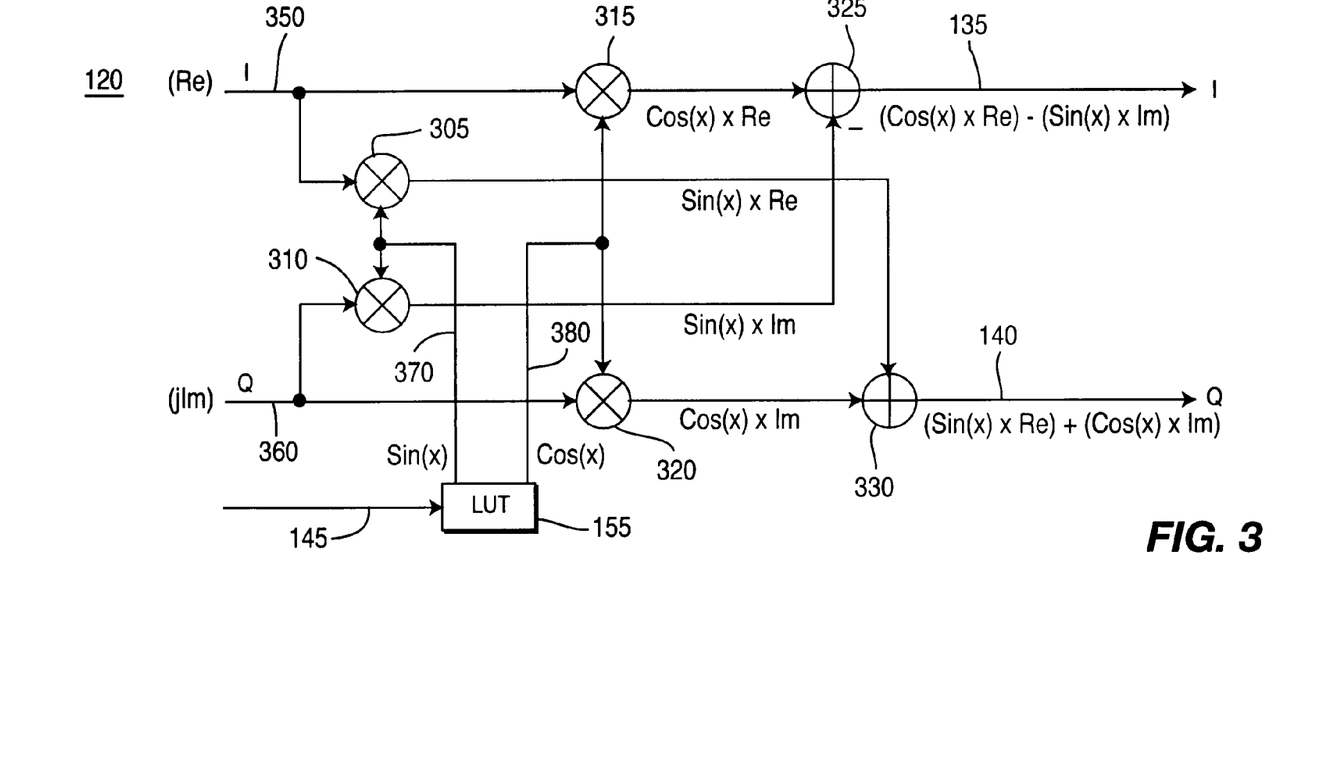
FIG. 3 is an exemplary configuration of the insertion phase variation compensation module of FIG. 1.

FIG. 3 shows an exemplary configuration of the insertion phase variation compensation module 120 which rotates the phase characteristics of the I and Q signal components of a digital complex signal output from the ADC 115 based on the amplification control signal 145, so as to counteract the effects of a phase offset intermittently introduced into a communication signal 150 by the amplifier 105. Thus, the modem 125 is not affected by the phase offset and the performance of the communication system 100 is not degraded.

As shown in FIG. 3, the insertion phase variation compensation module 120 includes multipliers 305, 310, 315, 320 and adders 325 and 330. The insertion phase variation compensation module 120 receives a real (Re) I signal component 350 and an imaginary (jIm) Q signal component 360 from the ADC 115 and rotates the phase of the signal components Re and jIm by x degrees ($e^{ix}$) as described by Equation 1 below:

$$(Re+jIm) \times e^{ix} = (Re+jIm) \times (\text{Cos}(x)+j\text{Sin}(x)) \quad \text{Equation 1}$$

The outcome of the real output, $\hat{Re}$, is described by Equation 2 below:

$$\hat{Re}=(\text{Cos}(x) \times Re)+(j^2 \times \text{Sin}(x) \times Im)=(\text{Cos}(x) \times Re)-(\text{Sin}(x) \times Im) \quad \text{Equation 2}$$

Note that if x is close to zero, then Cos(x)=1.0 and Sin(x)=x, as described by Equation 3 below:

$$\hat{Re}=Re-Im \times x \quad \text{Equation 3}$$

The output of the imaginary output, I m, is described by Equation 4 below:

$$\hat{Im}=(\text{Sin}(x) \times Re)+(\text{Cos}(x) \times Im) \quad \text{Equation 4}$$

Note that if x is close to zero, then Cos(x)=1.0 and Sin(x)=x, as described by Equation 5 below:

$$\hat{Im}=Im+Re \times x \quad \text{Equation 5}$$

Thus, as depicted by Equation 2, the real signal component 350 is multiplied by a Cos(x) function 380 specified by the LUT 155 via the multiplier 315 and the imaginary signal component 360 is multiplied by a Sin (x) function 370 also specified by the LUT 155 via the multiplier 310, whereby the output of the multiplier 310 is subtracted from the output of the multiplier 315 by the adder 325. Furthermore, as depicted by Equation 4, the real signal component 350 is multiplied by a Sin(x) function 370 specified by the LUT 155 via the multiplier 305 and the imaginary signal component 360 is multiplied by a Cos(x) function 380 also specified by the LUT 155 via the multiplier 320, whereby the output of the multiplier 320 is added to the output of the multiplier 305 by the adder 330.

In one embodiment, only a single phase compensation value is required to compensate for phase offsets caused by switching amplifier 105 on or off, whereby the insertion phase variation compensation module 120 may be disabled, using physical switching hardware, when the amplifier 105 is turned on. When the insertion phase variation compensation module 120 is disabled, the respective input and output I and Q signal components of the insertion phase variation module 120 are the same and the I and Q signal components pass through the insertion phase variation compensation module 120 unaffected. When the amplifier 105 is turned off, the insertion phase variation compensation module 120 is enabled, causing it to compensate for a phase offset by a phase adjustment X, caused by turning the amplifier 105 off. When the amplifier 105 is turned back on, the insertion phase variation compensation module 120 is again disabled, causing the phase to change from X to zero, which compensates for the phase offset caused by turning the amplifier 105 back on.

Alternatively, instead of using additional switching hardware, a first register (i.e., memory location) for storing the Sin(x) and a second register for storing the Cos(x) may be used to control the insertion phase variation compensation module 120 in similar fashion as described above (i.e., a zero phase offset or a phase offset x).

In another embodiment, a plurality of registers may be used to set the insertion phase variation compensation module 120 to any desired phase compensation value. The plurality of registers may include a first register for storing Sin(x), a second register for storing Sin(0), a third register for storing Cos(x) and a fourth register for storing Cos(0), where Sin(0)=0 and Cos(0)=1. If the amplifier 105 is turned on, the data in the second and fourth registers is applied as phase rotation error to the insertion phase variation compensation module 120. If the amplifier 105 is turned off, the data in the first and third registers is applied as phase rotation error to the insertion phase variation compensation module 120.

Figure 4:
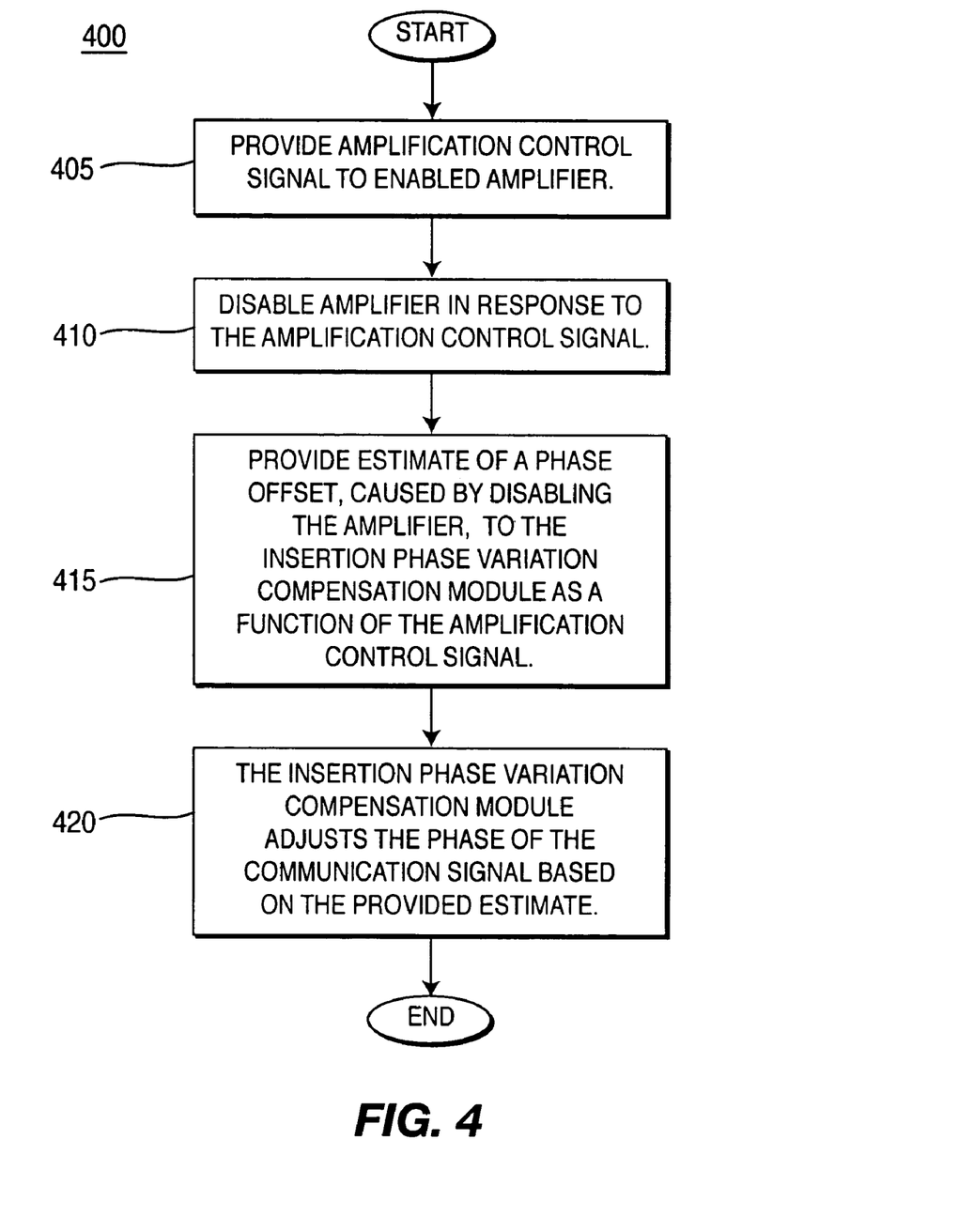
FIG. 4 is a flow chart of a process including steps implemented to counteract the effects of a phase offset intermittently introduced into a communication signal by disabling the amplifier of FIG. 1.

FIG. 4 is a flow chart of a process 400 including steps implemented to counteract the effects of a phase offset intermittently introduced into the communication signal 150 by disabling the amplifier 105. The process 400 may be implemented in any type of communication system. In step 405, the amplification control signal 145 is provided to an enabled amplifier 105 configured to receive a communication signal 150. In step 410, the enabled amplifier 105 is disabled in response to the amplification control signal 145, thus causing a phase offset to be intermittently introduced into the communication signal 150. In step 415, an estimate of the phase offset is provided to the insertion phase variation compensation module 120 as a function of the amplification control signal 145. In step 420, the insertion phase variation compensation module 120 adjusts the phase of the communication signal 150 based on the provided estimate.

Figure 5:
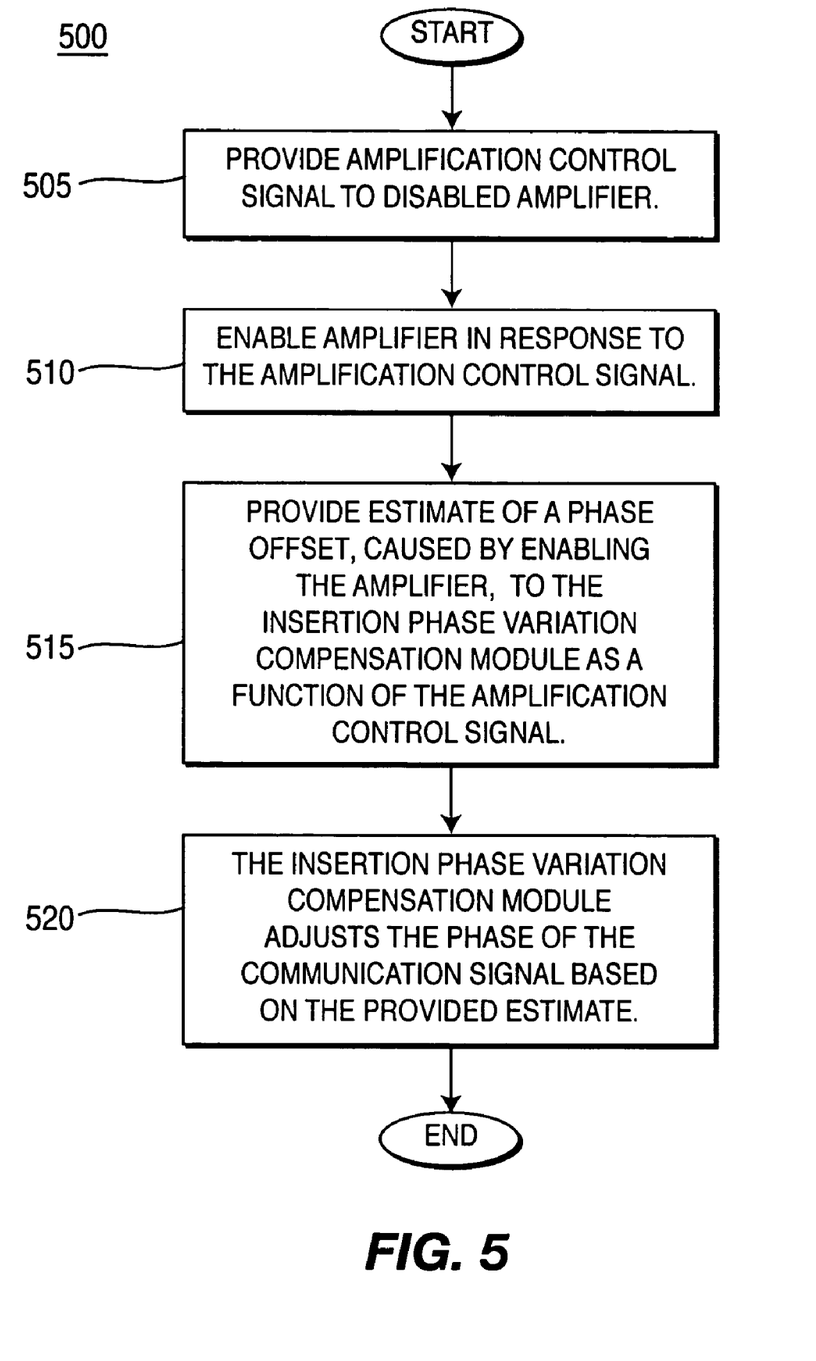
FIG. 5 is a flow chart of a process including steps implemented to counteract the effects of a phase offset intermittently introduced into a communication signal by enabling the amplifier of FIG. 1.

FIG. 5 is a flow chart of a process 500 including steps implemented to counteract the effects of a phase offset intermittently introduced into the communication signal 150 by enabling the amplifier 105. The process 500 may be implemented in any type of communication system. In step 505, the amplification control signal 145 is provided to a disabled amplifier 105 configured to receive a communication signal 150. In step 510, the disabled amplifier 105 is enabled in response to the amplification control signal 145, thus causing a phase offset to be intermittently introduced into the communication signal 150. In step 515, an estimate of the phase offset is provided to the insertion phase variation compensation module 120 as a function of the amplification control signal 145. In step 520, the insertion phase variation compensation module 120 adjusts the phase of the communication signal 150 based on the provided estimate.

Figure 6:
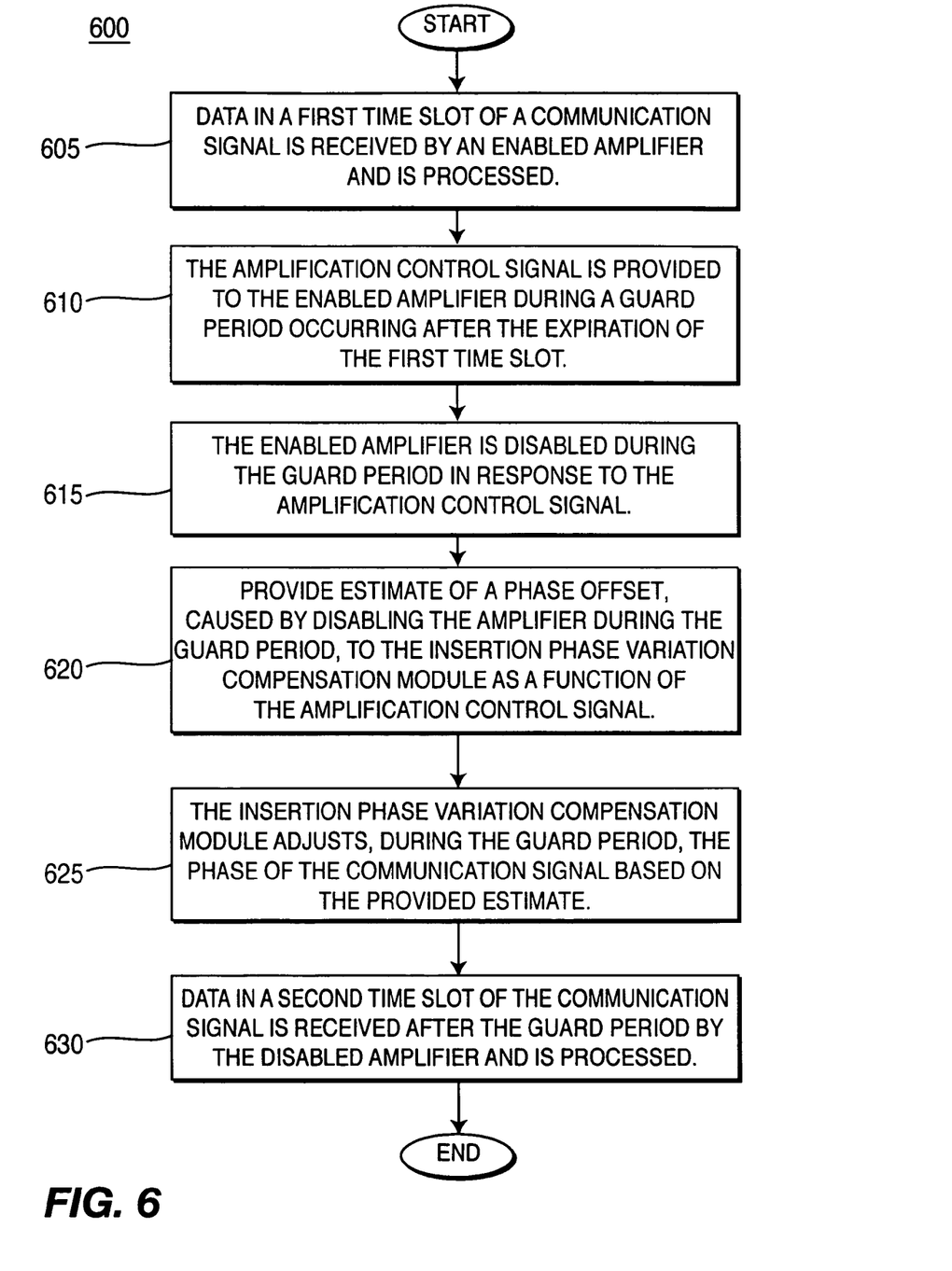
FIG. 6 is a flow chart of a process including steps implemented to counteract the effects of a phase offset intermittently introduced into a communication signal by disabling the amplifier of FIG. 1 during a guard period.

FIG. 6 is a flow chart of a process 600 including steps implemented to counteract the effects of a phase offset intermittently introduced into the communication signal 150 by disabling the amplifier 105 during a guard period. The process 600 may be implemented in a TDD, TDMA, TDSCDMA or other time-slotted communication system. In step 605, data in a first time slot 210 of a communication signal 150 is received by an enabled amplifier 105 and is processed. In step 610, the amplification control signal 145 is provided to the enabled amplifier 105 during a guard period 205 occurring after the first time slot 210 expires. In step 615, the enabled amplifier 105 is disabled during the guard period 205 in response to the amplification control signal 145, thus causing a phase offset to be intermittently introduced into the communication signal 150. In step 620, an estimate of the phase offset is provided during the guard period 205 to the insertion phase variation compensation module 120 as a function of the amplification control signal 145. In step 625, the insertion phase variation compensation module 120 adjusts, during the guard period 205, the phase of the communication signal 150 based on the provided estimate. In step 630, data in a second time slot 215 of the communication signal 150 is received by the disabled amplifier 105 after the guard period 205 and is processed.

Figure 7:
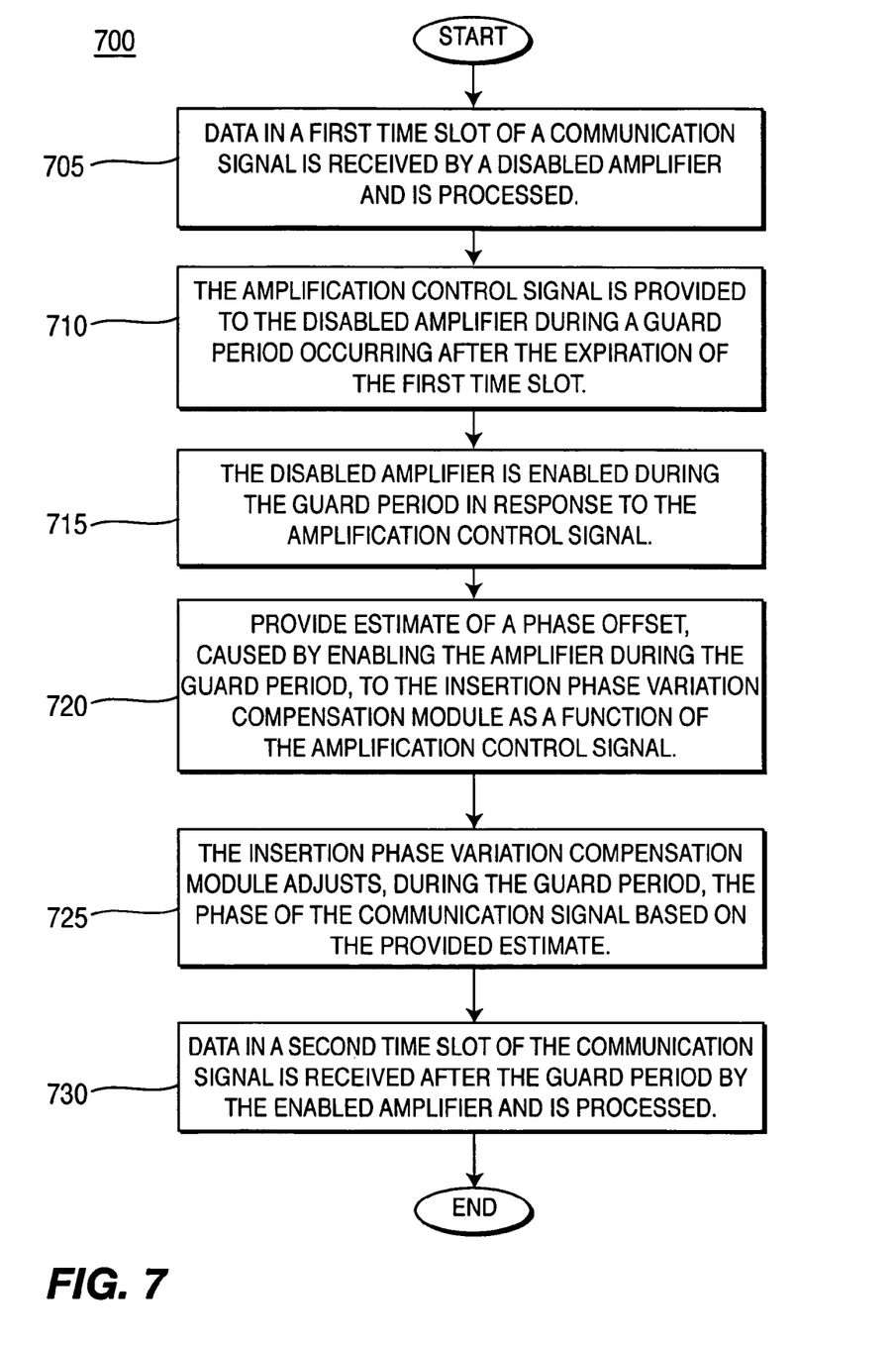
FIG. 7 is a flow chart of a process including steps implemented to counteract the effects of a phase offset intermittently introduced into a communication signal by enabling the amplifier of FIG. 1 during a guard period.

FIG. 7 is a flow chart of a process 700 including steps implemented to counteract the effects of a phase offset intermittently introduced into the communication signal 150 by enabling the amplifier 105 during a guard period. The process 700 may be in a TDD, TDMA, TDSCDMA or other time-slotted communication system. In step 705, data in a first time slot 210 of a communication signal 150 is received by a disabled amplifier 105 and is processed. In step 710, the amplification control signal 145 is provided to the disabled amplifier 105 during a guard period 205 occurring after the first time slot 210 expires. In step 715, the disabled amplifier 105 is enabled during the guard period 205 in response to the amplification control signal 145, thus causing a phase offset to be intermittently introduced into the communication signal 150. In step 720, an estimate of the phase offset is provided during the guard period 205 to the insertion phase variation compensation module 120 as a function of the amplification control signal 145. In step 725, the insertion phase variation compensation module 120 adjusts, during the guard period 205, the phase of the communication signal 150 based on the provided estimate. In step 730, data in a second time slot 215 of the communication signal 150 is received by the enabled amplifier 105 after the guard period 205 and is processed.

While this invention has been particularly shown and described with reference to preferred embodiments, it will be understood by those skilled in the art that various changes in form and details may be made therein without departing from the scope of the invention described hereinabove.

What is claimed is:

1. A communication system comprising:
   (a) an amplifier which receives a communication signal, the amplifier being controlled by an amplification control signal;
   (b) an insertion phase variation compensation module which counteracts the effects of a phase offset intermittently introduced into the communication signal when the amplifier is either enabled or disabled in response to the amplification control signal, wherein the communication signal is amplified by the amplifier when the amplifier is enabled, and the communication signal is not amplified by the amplifier when the amplifier is disabled;
   (c) a processor which generates the amplification control signal; and
   (d) a look up table (LUT) in communication with the processor and the insertion phase variation compensation module, wherein the LUT receives the amplification control signal from the processor and provides an estimate of the phase offset to the insertion phase variation compensation module as a function of the amplification control signal, the provided estimate includes a Sin function and a Cos function of the phase offset, x, the insertion phase variation compensation module has a real, Re, input associated with a digital in-phase (I) signal component and an imaginary, Im, input associated with a quadrature (Q) signal component and, based on the estimate provided by the LUT, the insertion phase variation compensation module outputs an I signal component having a phase that is adjusted in accordance with the following function: $(Cos(x) \times Re) - (Sin(x) \times Im)$.

2. The communication system of claim 1 further comprising:
   (e) a receiver which receives the communication signal from the amplifier and outputs analog in-phase (I) and quadrature (Q) signal components; and
   (f) an analog to digital converter (ADC) which receives the analog I and Q signal components from the receiver and converts the analog signal I and Q signal components to digital I and Q signal components.

3. The communication system of claim 2 wherein the insertion phase variation compensation module receives the digital I and Q signal components from the ADC and outputs altered I and Q signal components having different phase characteristics than the digital I and Q components, the communication system further comprising:
   (g) a modem which receives the altered I and Q signal components, the modem including a processor which generates the amplification control signal.

4. The communication system of claim 3 wherein the processor calculates how much power is input to the ADC.

5. The communication system of claim 2 wherein the insertion phase variation compensation module receives the digital I and Q components from the ADC and alters the phase characteristics of the digital I and Q components as a function of the amplification control signal.

6. The communication system of claim 1 wherein the communication signal includes first and second time slots separated by a guard period, and the amplification control signal is provided to the amplifier during the guard period after data in the first time slot is received by the amplifier and is processed.

7. The communication system of claim 1 wherein the communication signal includes first and second time slots separated by a guard period, and the amplifier is either enabled or disabled during the guard period after data in the first time slot is received by the amplifier and is processed.

8. The communication system of claim 7 wherein when data in the first time slot is received by the amplifier when the amplifier is disabled, the data in the second time slot is received by the amplifier when the amplifier is enabled.

9. The communication system of claim 7 wherein when data in the first time slot is received by the amplifier when the amplifier is enabled, the data in the second time slot is received by the amplifier when the amplifier is disabled.

10. The communication system of claim 1 wherein the communication signal includes first and second time slots separated by a guard period, and the estimate of the phase offset is provided to the insertion phase variation compensation module during the guard period after data in the first time slot is received by the amplifier and is processed.

11. The communication system of claim 1 wherein the communication signal includes first and second time slots separated by a guard period, and the insertion phase variation compensation module adjusts the phase of the communication signal based on the provided estimate during the guard period after data in the first time slot is received by the amplifier and is processed.

12. A communication system comprising:
    (a) an amplifier which receives a communication signal, the amplifier being controlled by an amplification control signal;
    (b) an insertion phase variation compensation module which counteracts the effects of a phase offset intermittently introduced into the communication signal when the amplifier is either enabled or disabled in response to the amplification control signal, wherein the communication signal is amplified by the amplifier when the amplifier is enabled, and the communication signal is not amplified by the amplifier when the amplifier is disabled;
    (c) a processor which generates the amplification control signal; and
    (d) a look up table (LUT) in communication with the processor and the insertion phase variation compensation module, wherein the LUT receives the amplification control signal from the processor and provides an estimate of the phase offset to the insertion phase variation compensation module as a function of the amplification control signal, wherein the provided estimate includes a Sin function and a Cos function of the phase offset, x, the insertion phase variation compensation module has a real input, Re, associated with a digital in-phase (I) signal component and an imaginary input, Im, associated with a quadrature (O) signal component and, based on the estimate provided by the LUT, the insertion phase variation compensation module outputs a Q signal component having a phase that is adjusted in accordance with the following function: $(Sin(x) \times Re) + (Cos(x) \times Im)$.

13. The communication system of claim 12, further comprising:
    (e) a receiver which receives the communication signal from the amplifier and outputs analog in-phase (I) and quadrature (Q) signal components; and
    (f) an analog to digital converter (ADC) which receives the analog I and Q signal components from the receiver and converts the analog I and Q signal components to digital I and Q signal components.

14. The communication system of claim 13 wherein the insertion phase variation compensation module receives the digital I and Q signal components from the ADC and outputs altered I and Q signal components having different phase characteristics than the digital I and Q components, the communication system further comprising:
- (g) a modem which receives the altered I and Q signal components, the modem including a processor which generates the amplification control signal.

15. The communication system of claim 14 wherein the processor calculates how much power is input to the ADC.

16. The communication system of claim 13 wherein the insertion phase variation compensation module receives the digital I and Q components from the ADC and alters the phase characteristics of the digital I and Q components as a function of the amplification control signal.

17. The communication system of claim 12 wherein the communication signal includes first and second time slots separated by a guard period, and the amplification control signal is provided to the amplifier during the guard period after data in the first time slot is received by the amplifier and is processed.

18. The communication system of claim 12 wherein the communication signal includes first and second time slots separated by a guard period, and the amplifier is either enabled or disabled during the guard period after data in the first time slot is received by the amplifier and is processed.

19. The communication system of claim 18 wherein when data in the first time slot is received by the amplifier when the amplifier is disabled, the data in the second time slot is received by the amplifier when the amplifier is enabled.

20. The communication system of claim 18 wherein when data in the first time slot is received by the amplifier when the amplifier is enabled, the data in the second time slot is received by the amplifier when the amplifier is disabled.

21. The communication system of claim 12 wherein the communication signal includes first and second time slots separated by a guard period, and the estimate of the phase offset is provided to the insertion phase variation compensation module during the guard period after data in the first time slot is received by the amplifier and is processed.

22. The communication system of claim 12 wherein the communication signal includes first and second time slots separated by a guard period, and the insertion phase variation compensation module adjusts the phase of the communication signal based on the provided estimate during the guard period after data in the first time slot is received by the amplifier and is processed.

23. A wireless transmit/receive unit (WTRU) comprising:
- (a) an amplifier which receives a communication signal, the amplifier being controlled by an amplification control signal;
- (b) an insertion phase variation compensation module which counteracts the effects of a phase offset intermittently introduced into the communication signal when the amplifier is either enabled or disabled in response to the amplification control signal, wherein the communication signal is amplified by the amplifier when the amplifier is enabled, and the communication signal is not amplified by the amplifier when the amplifier is disabled;
- (c) a processor which generates the amplification control signal; and
- (d) a look up table (LUT) in communication with the processor and the insertion phase variation compensation module, wherein the LUT receives the amplification control signal from the processor and provides an estimate of the phase offset to the insertion phase variation compensation module as a function of the amplification control signal, the provided estimate includes a Sin function and a Cos function of the phase offset, x, the insertion phase variation compensation module has a real, Re, input associated with a digital in-phase (I) signal component and an imaginary, Im, input associated with a quadrature (Q) signal component and, based on the estimate provided by the LUT, the insertion phase variation compensation module outputs an I signal component having a phase that is adjusted in accordance with the following function: $(Cos(x) \times Re) - (Sin(x) \times Im)$.

24. The WTRU of claim 23 further comprising:
- (e) a receiver which receives the communication signal from the amplifier and outputs analog in-phase (I) and quadrature (Q) signal components; and
- (f) an analog to digital converter (ADC) which receives the analog I and Q signal components from the receiver and converts the analog I and Q signal components to digital I and Q signal components.

25. The WTRU of claim wherein the insertion phase variation compensation module receives the digital I and Q signal components from the ADC and outputs altered I and Q signal components having different phase characteristics than the digital I and Q components, the WTRU further comprising:
- (g) a modem which receives the altered I and Q signal components, the modem including a processor which generates the amplification control signal.

26. The WTRU of claim 25 wherein the processor calculates how much power is input to the ADC.

27. The WTRU of claim 24 wherein the insertion phase variation compensation module receives the digital I and Q components from the ADC and alters the phase characteristics of the digital I and Q components as a function of the amplification control signal.

28. The WTRU of claim 23 wherein the communication signal includes first and second time slots separated by a guard period, and the amplification control signal is provided to the amplifier during the guard period after data in the first time slot is received by the amplifier and is processed.

29. The WTRU of claim 23 wherein the communication signal includes first and second time slots separated by a guard period, and the amplifier is either enabled or disabled during the guard period after data in the first time slot is received by the amplifier and is processed.

30. The WTRU of claim 29 wherein when data in the first time slot is received by the amplifier when the amplifier is disabled, the data in the second time slot is received by the amplifier when the amplifier enabled.

31. The WTRU of claim 29 wherein when data in the first time slot is received by the amplifier when the amplifier is enabled, the data in the second time slot is received by the amplifier when the amplifier disabled.

32. The WTRU of claim 23 wherein the communication signal includes first and second time slots separated by a guard period, and the estimate of the phase offset is provided to the insertion phase variation compensation module during the guard period after data in the first time slot is received by the amplifier and is processed.

33. The WTRU of claim 23 wherein the communication signal includes first and second time slots separated by a guard period, and the insertion phase variation compensation module adjusts the phase of the communication signal based on the provided estimate during the guard period after data in the first time slot is received by the amplifier and is processed.

34. A wireless transmit/receive unit (WTRU) comprising:
(a) an amplifier which receives a communication signal, the amplifier being controlled by an amplification control signal;
(b) an insertion phase variation compensation module which counteracts the effects of a phase offset intermittently introduced into the communication signal when the amplifier is either enabled or disabled in response to the amplification control signal, wherein the communication signal is amplified by the amplifier when the amplifier is enabled, and the communication signal is not amplified by the amplifier when the amplifier is disabled;
(c) a processor which generates the amplification control signal; and
(d) a look up table (LUT) in communication with the processor and the insertion phase variation compensation module, wherein the LUT receives the amplification control signal from the processor and provides an estimate of the phase offset to the insertion phase variation compensation module as a function of the amplification control signal, the provided estimate includes a Sin function and a Cos function of the phase offset, x, the insertion phase variation compensation module has a real input, Re, associated with a digital in-phase (I) signal component and an imaginary input, Im, associated with a quadrature (O) signal component and, based on the estimate provided by the LUT, the insertion phase variation compensation module outputs a Q signal component having a phase that is adjusted in accordance with the following function: $(\text{Sin}(x) \times \text{Re}) + (\text{Cos}(x) \times \text{Im})$.

35. The WTRU of claim 34 further comprising:
(e) a receiver which receives the communication signal from the amplifier and outputs analog in-phase (I) and quadrature (Q) signal components; and
(f) an analog to digital converter (ADC) which receives the analog I and Q signal components from the receiver and converts the analog I and Q signal components to digital I and Q signal components.

36. The WTRU of claim 35 wherein the insertion phase variation compensation module receives the digital I and Q signal components from the ADC and outputs altered I and Q signal components having different phase characteristics than the digital I and Q components, the WTRU further comprising:
(g) a modem which receives the altered I and Q signal components, the modem including a processor which generates the amplification control signal.

37. The WTRU of claim 36 wherein the processor calculates how much power is input to the ADC.

38. The WTRU of claim 35 wherein the insertion phase variation compensation module receives the digital I and Q components from the ADC and alters the phase characteristics of the digital I and Q components as a function of the amplification control signal.

39. The WTRU of claim 34 wherein the communication signal includes first and second time slots separated by a guard period, and the amplification control signal is provided to the amplifier during the guard period after data in the first time slot is received by the amplifier and is processed.

40. The WTRU of claim 34 wherein the communication signal includes first and second time slots separated by a guard period, and the amplifier is either enabled or disabled during the guard period after data in the first time slot is received by the amplifier and is processed.

41. The WTRU of claim 40 wherein when data in the first time slot is received by the amplifier when the amplifier is disabled, the data in the second time slot is received by the amplifier when the amplifier is enabled.

42. The WTRU of claim 40 wherein when data in the first time slot is received by the amplifier when the amplifier is enabled, the data in the second time slot is received by the amplifier when the amplifier is disabled.

43. The WTRU of claim 34 wherein the communication signal includes first and second time slots separated by a guard period, and the estimate of the phase offset is provided to the insertion phase variation compensation module during the guard period after data in the first time slot is received by the amplifier and is processed.

44. The WTRU of claim 34 wherein the communication signal includes first and second time slots separated by a guard period, and the insertion phase variation compensation module adjusts the phase of the communication signal based on the provided estimate during the guard period after data in the first time slot is received by the amplifier and is processed.

45. An integrated circuit (IC) comprising:
(a) an amplifier which receives a communication signal, the amplifier being controlled by an amplification control signal;
(b) an insertion phase variation compensation module which counteracts the effects of a phase offset intermittently introduced into the communication signal when the amplifier is either enabled or disabled in response to the amplification control signal, wherein the communication signal is amplified by the amplifier when the amplifier is enabled, and the communication signal is not amplified by the amplifier when the amplifier is disabled;
(c) a processor which generates the amplification control signal; and
(d) a look up table (LUT) in communication with the processor and the insertion phase variation compensation module, wherein the LUT receives the amplification control signal from the processor and provides an estimate of the phase offset to the insertion phase variation compensation module as a function of the amplification control signal, the provided estimate includes a Sin function and a Cos function of the phase offset, x, the insertion phase variation compensation module has a real, Re, input associated with a digital in-phase (I) signal component and an imaginary, Im, input associated with a quadrature (O) signal component and, based on the estimate provided by the LUT, the insertion phase variation compensation module outputs an I signal component having a phase that is adjusted in accordance with the following function: $(\text{Cos}(x) \times \text{Re}) - (\text{Sin}(x) \times \text{Im})$.

46. The IC of claim further comprising:
(e) a receiver which receives the communication signal from the amplifier and outputs analog in-phase (I) and quadrature (Q) signal components; and
(f) an analog to digital converter (ADC) which receives the analog I and Q signal components from the receiver and converts the analog I and Q signal components to digital I and Q signal components.

47. The IC of claim 46 wherein the insertion phase variation compensation module receives the digital I and Q signal components from the ADC and outputs altered I and Q signal components having different phase characteristics than the digital I and Q components, the IC further comprising:

(g) a modem which receives the altered I and Q signal components, the modem including a processor which generates the amplification control signal.

48. The IC of claim 47, wherein the processor calculates how much power is input to the ADC.

49. The IC of claim 46 wherein the insertion phase variation compensation module receives the digital I and Q components from the ADC and alters the phase characteristics of the digital I and Q components as a function of the amplification control signal.

50. The IC of claim 45 wherein the communication signal includes first and second time slots separated by a guard period, and the amplification control signal is provided to the amplifier during the guard period after data in the first time slot is received by the amplifier and is processed.

51. The IC of claim 45 wherein the communication signal includes first and second time slots separated by a guard period, and the amplifier is either enabled or disabled during the guard period after data in the first time slot is received by the amplifier and is processed.

52. The IC of claim 51 wherein when data in the first time slot is received by the amplifier when the amplifier is disabled, the data in the second time slot is received by the amplifier when the amplifier is enabled.

53. The IC of claim 51 wherein when data in the first time slot is received by the amplifier when the amplifier is enabled, the data in the second time slot is received by the amplifier when the amplifier is disabled.

54. The IC of claim 45 wherein the communication signal includes first and second time slots separated by a guard period, and the estimate of the phase offset is provided to the insertion phase variation compensation module during the guard period after data in the first time slot is received by the amplifier and is processed.

55. The IC of claim 45 wherein the communication signal includes first and second time slots separated by a guard period, and the insertion phase variation compensation module adjusts the phase of the communication signal based on the provided estimate during the guard period after data in the first time slot is received by the amplifier and is processed.

56. An integrated circuit (IC) comprising:
(a) an amplifier which receives a communication signal, the amplifier being controlled by an amplification control signal;
(b) an insertion phase variation compensation module which counteracts the effects of a phase offset intermittently introduced into the communication signal when the amplifier is either enabled or disabled in response to the amplification control signal, wherein the communication signal is amplified by the amplifier when the amplifier is enabled, and the communication signal is not amplified by the amplifier when the amplifier is disabled;
(c) a processor which generates the amplification control signal; and
(d) a look up table (LUT) in communication with the processor and the insertion phase variation compensation module, wherein the LUT receives the amplification control signal from the processor and provides an estimate of the phase offset to the insertion phase variation compensation module as a function of the amplification control signal, the insertion phase variation compensation module has a real input, Re, associated with a digital in-phase (I) signal component and an imaginary input, Im, associated with a quadrature (Q) signal component and, based on the estimate provided by the LUT, the insertion phase variation compensation module outputs a Q signal component having a phase that is adjusted in accordance with the following function: $(\sin(x) \times Re) + (\cos(x) \times Im)$.

57. The IC of claim 56 further comprising:
(e) a receiver which receives the communication signal from the amplifier and outputs analog in-phase (I) and quadrature (O) signal components; and
(f) an analog to digital converter (ADC) which receives the analog I and Q signal components from the receiver and converts the analog I and Q signal components to digital I and Q signal components.

58. The IC of claim 57 wherein the insertion phase variation compensation module receives the digital I and Q signal components from the ADC and outputs altered I and Q signal components having different phase characteristics than the digital I and Q components, the IC further comprising:
(g) a modem which receives the altered I and Q signal components, the modem including a processor which generates the amplification control signal.

59. The IC of claim 58 wherein the processor calculates how much power is input to the ADC.

60. The IC of claim 57 wherein the insertion phase variation compensation module receives the digital I and Q components from the ADC and alters the phase characteristics of the digital I and Q components as a function of the amplification control signal.

61. The IC of claim 56 wherein the communication signal includes first and second time slots separated by a guard period, and the amplification control signal is provided to the amplifier during the guard period after data in the first time slot is received by the amplifier and is processed.

62. The IC of claim 56 wherein the communication signal includes first and second time slots separated by a guard period, and the amplifier is either enabled or disabled during the guard period after data in the first time slot is received by the amplifier and is processed.

63. The IC of claim 62 wherein when data in the first time slot is received by the amplifier when the amplifier is disabled, the data in the second time slot is received by the amplifier when the amplifier enabled.

64. The IC of claim 62 wherein when data in the first time slot is received by the amplifier when the amplifier is enabled, the data in the second time slot is received by the amplifier when the amplifier is disabled.

65. The IC of claim 56 wherein the communication signal includes first and second time slots separated by a guard period, and the estimate of the phase offset is provided to the insertion phase variation compensation module during the guard period after data in the first time slot is received by the amplifier and is processed.

66. The IC of claim 56 wherein the communication signal includes first and second time slots separated by a guard period, and the insertion phase variation compensation module adjusts the phase of the communication signal based on the provided estimate during the guard period after data in the first time slot is received by the amplifier and is processed.

67. In a communication system including an amplifier and an insertion phase variation compensation module, a method of counteracting the effects of a phase offset intermittently introduced into a communication signal when the amplifier is enabled, the method comprising:
(a) providing an amplification control signal to the amplifier when the amplifier is disabled;

(b) enabling the amplifier in response to the amplification control signal, the enabling of the amplifier causing a phase offset to be introduced into the communication signal;

(c) providing an estimate of the phase offset to the insertion phase variation compensation module as a function of the amplification control signal; and (d) the insertion phase variation compensation module adjusting the phase of the communication signal based on the provided estimate, wherein the provided estimate includes a Sin function and a Cos function of the phase offset, x, the insertion phase variation compensation module has a real, Re, input associated with a digital in-phase (I) signal component and an imaginary, Im, input associated with a quadrature (Q) signal component and, based on the provided estimate, the insertion phase variation compensation module outputs an I signal component having a phase that is adjusted in accordance with the following function: (Cos(x)×Re)−(Sin(x)×Im).

68. The method of claim 67 wherein the communication signal includes first and second time slots separated by a guard period, and at least one of steps (a)–(d) are implemented during the guard period after data in the first time slot is received by the amplifier and is processed.

69. The method of claim 67 wherein the communication signal includes first and second time slots separated by a guard period such that data in the first time slot is received by the amplifier when the amplifier is disabled and data in the second time slot is received by the amplifier when the amplifier is enabled.

70. In a communication system including an amplifier and an insertion phase variation compensation module, a method of counteracting the effects of a phase offset intermittently introduced into a communication signal when the amplifier is disabled, the method comprising:

(a) providing an amplification control signal to the amplifier when the amplifier is enabled;

(b) disabling the amplifier in response to the amplification control signal, the disabling of the amplifier causing a phase offset to be introduced into the communication signal;

(c) providing an estimate of the phase offset to the insertion phase variation compensation module as a function of the amplification control signal; and (d) the insertion phase variation compensation module adjusting the phase of the communication signal based on the provided estimate, wherein the provided estimate includes a Sin function and a Cos function of a phase offset, x, the insertion phase variation compensation module has a real, Re, input associated with a digital in-phase (I) signal component and an imaginary, Im, input associated with a quadrature (Q) signal component and, based on the provided estimate, the insertion phase variation compensation module outputs an I signal component having a phase that is adjusted in accordance with the following function: (Cos(x)×Re)−(Sin(x)×Im).

71. The method of claim 70 wherein the communication signal includes first and second time slots separated by a guard period, and at least one of steps (a)–(d) are implemented during the guard period after data in the first time slot is received by the amplifier and is processed.

72. The method of claim 70 wherein the communication signal includes first and second time slots separated by a guard period such that data in the first time slot is received by the amplifier when the amplifier enabled and data in the second time slot is received by the amplifier when the amplifier is disabled.

73. In a communication system including an amplifier and an insertion phase variation compensation module, a method of counteracting the effects of a phase offset intermittently introduced into a communication signal when the amplifier is enabled, the method comprising:

(a) providing an amplification control signal to the amplifier when the amplifier is disabled;

(b) enabling the amplifier in response to the amplification control signal, the enabling of the amplifier causing a phase offset to be introduced into the communication signal;

(c) providing an estimate of the phase offset to the insertion phase variation compensation module as a function of the amplification control signal; and (d) the insertion phase variation compensation module adjusting the phase of the communication signal based on the provided estimate, wherein the provided estimate includes a Sin function and a Cos function of the phase offset, x, the insertion phase variation compensation module has a real input, Re, associated with a digital in-phase (I) signal component and an imaginary input, Im, associated with a quadrature (Q) signal component and, based on the provided estimate, the insertion phase variation compensation module outputs a Q signal component having a phase that is adjusted in accordance with the following function: (Sin(x)×Re)+(Cos(x)×Im).

74. The method of claim 73 wherein the communication signal includes first and second time slots separated by a guard period, and at least one of steps (a)–(d) are implemented during the guard period after data in the first time slot is received by the amplifier and is processed.

75. The method of claim 73 wherein the communication signal includes first and second time slots separated by a guard period such that data in the first time slot is received by the amplifier when the amplifier is disabled and data in the second time slot is received by the amplifier when the amplifier enabled.

76. In a communication system including an amplifier and an insertion phase variation compensation module, a method of counteracting the effects of a phase offset intermittently introduced into a communication signal when the amplifier is disabled, the method comprising:

(a) providing an amplification control signal to the amplifier when the amplifier is enabled;

(b) disabling the amplifier in response to the amplification control signal, the disabling of the amplifier causing a phase offset to be introduced into the communication signal;

(c) providing an estimate of the phase offset to the insertion phase variation compensation module as a function of the amplification control signal; and (d) the insertion phase variation compensation module adjusting the phase of the communication signal based on the provided estimate, wherein the provided estimate includes a Sin function and a Cos function of a phase offset, x, the insertion phase variation compensation module has a real input, Re, associated with a digital in-phase (I) signal component and an imaginary input, Im, associated with a quadrature (Q) signal component and, based on the provided estimate, the insertion phase variation compensation module outputs a Q signal component having a phase that is adjusted in accordance with the following function: $(\text{Sin}(x) \times \text{Re}) + (\text{Cos}(x) \times \text{Im})$.

77. The method of claim 76 wherein the communication signal includes first and second time slots separated by a guard period, and at least one of steps (a)–(d) are implemented during the guard period after data in the first time slot is received by the amplifier and is processed.

78. The method of claim 76 wherein the communication signal includes first and second time slots separated by a guard period such that data in the first time slot is received by the amplifier when the amplifier is enabled and data in the second time slot is received by the amplifier when the amplifier is disabled.

* * * * *

UNITED STATES PATENT AND TRADEMARK OFFICE
CERTIFICATE OF CORRECTION

| | | |
|---|---|---|
| PATENT NO. | : 7,016,433 B2 | |
| APPLICATION NO. | : 10/736381 | |
| DATED | : March 21, 2006 | |
| INVENTOR(S) | : Demir et al. | |

It is certified that error appears in the above-identified patent and that said Letters Patent is hereby corrected as shown below:

At column 2, line 35, after the word "may", insert --be--.

At column 4, line 53, after the word "output", delete "Im" and insert therefor --$\hat{I}_m$--.

At claim 12, column 8, line 50, after the word "quadrature", delete "(O)" and insert therefor --(Q)--.

At claim 25, column 10, line 19, after the word "claim", insert --24--.

At claim 30, column 10, line 50, after the word "amplifier", insert --is--.

At claim 31, column 10, line 54, after the word "amplifier", insert --is--.

At claim 34, column 11, line 27, after the word "quadrature", delete "(O)" and insert therefor --(Q)--.

At claim 45, column 12, line 48, after the word "quadrature", delete "(O)" and insert therefor --(Q)--.

At claim 46, column 12, line 54, after the word "claim", insert --45--.

At claim 57, column 14, line 8, after the word "quadrature", delete "(O)" and insert therefor --(Q)--.

At claim 63, column 14, line 42, after the word "amplifier", insert --is--.

UNITED STATES PATENT AND TRADEMARK OFFICE
CERTIFICATE OF CORRECTION

PATENT NO. : 7,016,433 B2
APPLICATION NO. : 10/736381
DATED : March 21, 2006
INVENTOR(S) : Demir et al.

It is certified that error appears in the above-identified patent and that said Letters Patent is hereby corrected as shown below:

At claim 72, column 16, line 1, after the word "amplifier", insert --is--.

At claim 75, column 16, line 42, after the word "amplifier", insert --is--.

Signed and Sealed this

Seventh Day of November, 2006

JON W. DUDAS
*Director of the United States Patent and Trademark Office*